United States Patent [19]

Fleissner et al.

[11] Patent Number: 5,105,162
[45] Date of Patent: Apr. 14, 1992

[54] ELECTRICALLY TUNED RF RECEIVER, APPARATUS AND METHOD THEREFOR

[75] Inventors: Thomas Fleissner, Warren; Gerald M. Brehmer, Allen Park, both of Mich.

[73] Assignee: United Technologies Automotive, Dearborn, Mich.

[21] Appl. No.: 718,145

[22] Filed: Jun. 20, 1991

[51] Int. Cl.$^5$ .................... H03B 5/00; H03D 11/04
[52] U.S. Cl. .................... 329/359; 331/107 A; 331/177 V; 455/336
[58] Field of Search ........... 331/107 A, 108 B, 117 D, 331/117 R, 117 FE, 167, 168, 177 V, 185; 329/324, 359; 455/215, 336

[56] References Cited

U.S. PATENT DOCUMENTS

| | | | |
|---|---|---|---|
| 2,936,428 | 5/1960 | Schweitzer | 455/336 X |
| 3,868,595 | 2/1975 | Capps, Jr. et al. | 331/108 |
| 4,325,032 | 4/1982 | Gilden | 331/107 A X |
| 4,749,964 | 6/1988 | Ash | 331/107 |
| 5,043,681 | 8/1991 | Tanemura et al. | 331/107 A |

*Primary Examiner*—Davis Mis
*Attorney, Agent, or Firm*—Michael Grillo

[57] ABSTRACT

An electrically tuned super-regenerative receiver (10) comprises a feedback type oscillator having a signal output and a signal input, phase shift components (30) connected in a feedback loop for coupling the signal output to the signal input to cause oscillations, and a quench oscillator (35) coupled to the signal input for switching the oscillator between an oscillating and a non-oscillating condition. A variable capacitance device (40), such as a varactor diode, is connected between the signal output and a reference potential (21), and a microprocessor (105) provides a tuning voltage (42) which is applied at the signal output for varying the current in the varactor diode, thereby varying the oscillator center operating frequency. The oscillator center operating frequency is detected by a spectrum analyzer (112) and compared to a desired center operating frequency by a controller (118). The controller controls a signal generator (123) to transmit a control signal which is received by the receiver and provided to the microprocessor for varying the tuning voltage to change the oscillator center operating frequency to be equal to the desired center operating frequency. An EEPROM (108) is provided for storing the tuning voltage required to produce oscillations at the desired center operating frequency.

13 Claims, 3 Drawing Sheets

ELECTRICALLY TUNED RF RECEIVER, APPARATUS AND METHOD THEREFOR

TECHNICAL FIELD

The present invention relates to radio frequency (rf) receivers, and more particularly to a super-regenerative receiver having automated tuning of the receiver center operating frequency.

BACKGROUND OF THE INVENTION

A super-regenerative receiver is a type of regenerative circuit containing an oscillator which is automatically switched between an oscillating and a non-oscillating condition. Oscillations are initiated by introducing a voltage (quench voltage) in a feedback loop of the oscillator at a switching frequency known as the "quench" frequency. During operation of the receiver, the net voltage in the feedback loop of the oscillator increases near the positive peaks of each cycle of the quench voltage, i.e., when the quench voltage is added to the supply voltage, thereby causing oscillations to build up in the circuit. During its negative half-cycle, the quench voltage will lower the net voltage supplied to the oscillator to the point where any started oscillations die out. Signal voltages that are to be detected are also connected in the feedback loop of the oscillator to thereby initiate oscillations upon application of a signal voltage.

In the absence of an applied signal, the oscillations that build up during each positive cycle of the quench voltage start with an initial amplitude determined by the noise voltages in the input circuit, e.g., thermal agitation noise in the tuned input circuit, and reach a final value corresponding to the equilibrium value for the oscillator. These oscillations then die out as the quench voltage becomes small and then goes negative or too low to provide oscillating conditions. If an rf carrier signal is superimposed upon the system and is larger in magnitude than the noise voltage, the initial amplitude, as the oscillations start to build up, corresponds to the amplitude of the superimposed rf carrier signal. The oscillations, therefore, reach equilibrium more quickly during application of the rf carrier signal because of the larger initial amplitude. The rf carrier signal is amplitude modulated with a desired information signal which is recovered at the output of the receiver, e.g., with a low pass filter which rejects the rf carrier and the quench signal.

Traditionally, super-regenerative receivers were LC controlled. Such receivers use inductors and capacitors in the oscillator feedback circuit, thereby causing the oscillator to oscillate at the LC circuit's resonant frequency. Therefore, the operating frequency at which the receiver oscillates is directly related to the inductive and capacitive values respectively of the inductors and capacitors in the LC circuit. However, such LC circuits cause the receiver operating frequency to be unstable over time and to drift from its desired operating frequency due to changes in the values of the inductors and capacitors with age. In addition, LC circuits are temperature sensitive, which causes the receiver operating frequency to change with changes in temperature.

Generally, it is desirable for a super-regenerative receiver to have a relatively narrow frequency response, with the center operating frequency of the receiver (center frequency of reception) being selected to provide the desired reception band, i.e., the particular range of frequencies that the receiver will be sensitive to receiving. However, super-regenerative receivers having LC-controlled oscillations have relatively wide reception bands and are therefore influenced by stray signals and noise.

To overcome the above problems associated with using an LC feedback circuit in a super-regenerative receiver, surface acoustic wave (SAW) devices have been used to replace the LC devices in the receiver feedback circuit. For example, U.S. Pat. No. 4,749,964 to Ash discloses a super-regenerative detector having a SAW device in the feedback circuit of the detector. The SAW device utilized in the '964 patent is a single phase, unidirectional transducer with quarter wavelength electrodes in spacing allowing operation of the detector at very high frequencies. Such a SAW device provides a feedback circuit which has low loss, is temperature stable, and provides the necessary phase shift in the feedback circuit to cause oscillations of the detector.

In both a super-regenerative receiver having a LC feedback circuit and the SAW delay line receiver, the center frequency of reception is adjusted by means of a variable inductor. The variable inductor includes an air wound coil with a movable metal slug in the center. The slug is repositioned within the coil to provide a slight change in the actual inductance value, thereby changing the receiver center operating frequency. This adjustment normally requires a person in the manufacturing environment to perform. In low volume applications, such a manual adjustment may be tolerable. However, in highly competitive high volume markets, such as the automotive industry, this technique is far too costly.

DISCLOSURE OF THE INVENTION

Objects of the present invention include provision of an improved super-regenerative receiver which provides automated tuning of the receiver center operating frequency.

According to the present invention, a super-regenerative receiver comprises a feedback type oscillator having a signal output and a signal input; phase shift components connected in a feedback loop for coupling the signal output to the signal input to cause oscillations; a quench oscillator coupled to the signal input for switching the oscillator between an oscillating and a non-oscillating condition; a variable capacitance device, such as a varactor diode, connected between the signal output and a reference potential; and a tuning voltage applied at the signal output for varying the current in the varactor diode, thereby varying the oscillator center operating frequency.

In further accord with the present invention, the oscillator center operating frequency is compared to a desired center operating frequency, and the tuning voltage is automatically varied for varying the oscillator center operating frequency to be equal to the desired center operating frequency.

In still further accord with the present invention the tuning voltage required to produce oscillations at the desired center operating frequency is stored in a memory for permanent reference.

The present invention provides a reliable and accurate method of automatically tuning the center operating frequency of a super-regenerative receiver. Therefore, the super-regenerative receiver of the present invention is particularly useful in a high volume application wherein mechanical tuning would be impractical because of the high personnel costs involved. Additionally, such automatic tuning reduces the overall cost of using such a super-regenerative receiver, and therefore, the applications using such a receiver may be expanded.

The foregoing and other objects, features and advantages of the present invention will become more apparent in light of the following detailed description of exemplary embodiments thereof, as illustrated in the accompanying drawings.

BEST MODE FOR CARRYING OUT THE INVENTION

Figure 1:
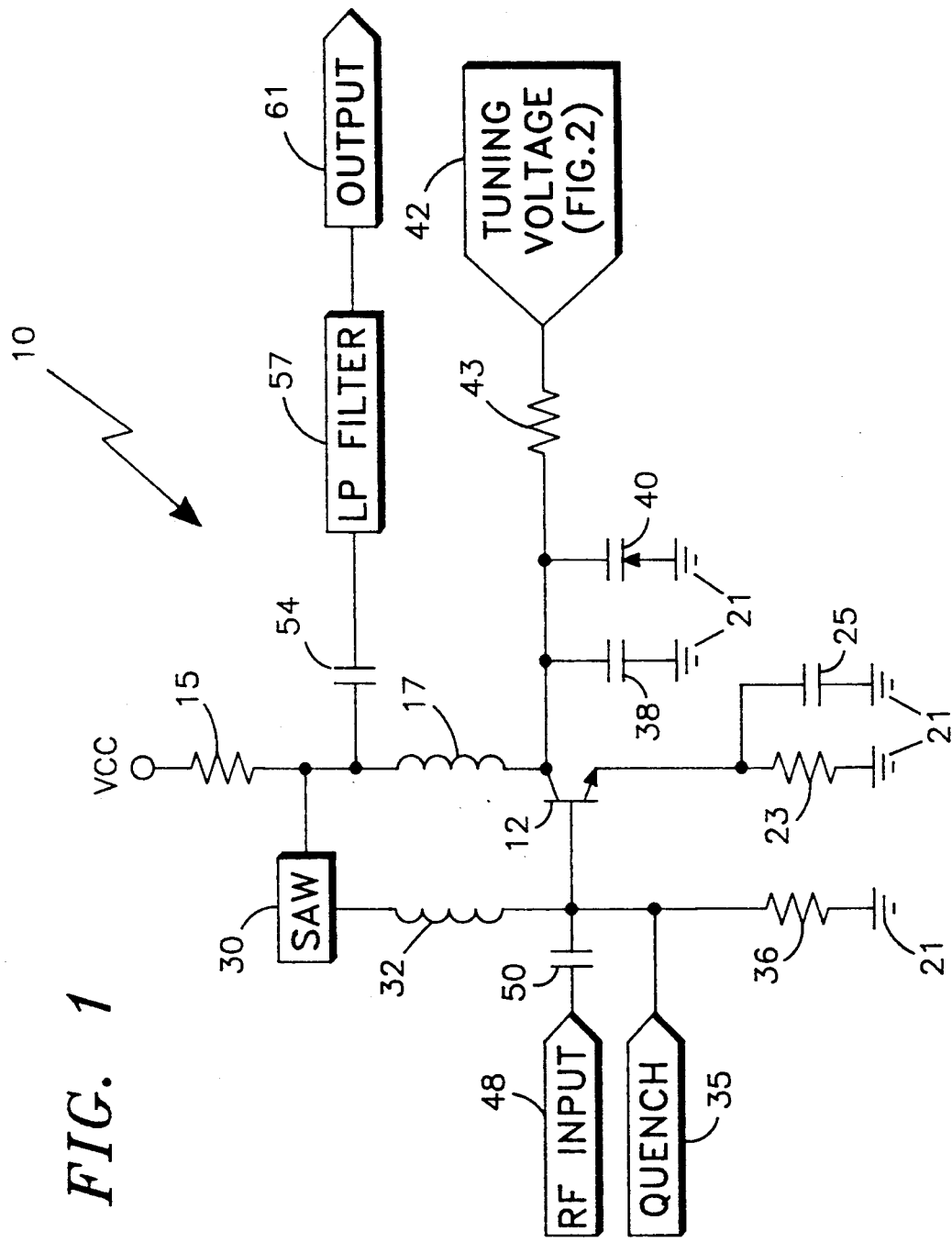
FIG. 1 is a schematic block diagram of an electronically tuned super-regenerative receiver having a surface acoustic wave device as the phase shift element in the feedback circuit of the receiver.

The super-regenerative receiver of the present invention is particularly well suited for automated tuning of the receiver center operating frequency. Referring generally to FIG. 1, a super-regenerative receiver 10 comprises a bipolar transistor 12 in a common emitter amplifier configuration. A dc voltage, VCC, is coupled to the collector of the transistor 12 via a resistor 15 and an inductor 17. The transistor emitter is coupled to a reference potential 21, e.g., ground, via an emitter biasing resistor 23. The emitter is also coupled to ground via an emitter bypass capacitor 25 for improved bias stability.

In the exemplary embodiment of the invention, a SAW delay line device 30 is used as the phase shift element in the receiver feedback circuit. The SAW device 30 is connected in a feedback loop from the transistor base, via an inductor 32, to the transistor collector, via the inductor 17. The SAW device 30 may be of a type known in the art for providing a feedback circuit which has low loss, is temperature stable, and provides the necessary phase shift in the feedback circuit to cause oscillations. A quench oscillator 35 is connected to the transistor base, and applies a quench voltage at a quench frequency rate to the feedback circuit. The inductors 17,32 on each leg of the SAW device 30 are selected so that the circuit easily begins oscillating at some frequency close to the desired center operating frequency when the quench voltage is applied to the feedback circuit.

A capacitor 38 is connected to the transistor collector leg as a temperature compensating element to compensate for drift incurred by the transistor over a temperature range of, e.g., $-40°$ C. to $+85°$ C. A variable capacitance device 40, e.g., a varactor diode, is also connected to the collector leg in parallel with the temperature compensating capacitor 38. Slight changes in capacitance at the collector leg causes a slight change in the receiver center operating frequency. A tuning voltage 42 is supplied to the varactor diode 40 via a resistor 43. The resistor 43 controls the amount of current flowing through the varactor diode 40, and the capacitance of the varactor diode changes in response to changes in the applied current. Therefore, by increasing or decreasing the tuning voltage at the input of the resistor 43, the current through the varactor diode changes, thereby causing the receiver center operating frequency to change. For example, in the exemplary embodiment of the invention, a 2 picofarad change in the capacitance of the varactor diode 40 results in a 250 kilohertz change in the receiver center operating frequency.

A modulated rf input signal is provided on input terminal 48 and is coupled through a capacitor 50 to the base of the transistor 12 in the feedback loop. An incoming rf signal raises the signal level at the base of the transistor when added to the quench voltage to cause the transistor to break into oscillations more quickly than when thermal noise alone is providing the input voltage. Each time the transistor conducts due to the quench voltage, the modulated rf input signal voltage is superimposed on the quench voltage and is coupled through a capacitor 54 to a low pass filter 57. The filter 57 removes the carrier and the quench frequency, and allows the modulated signal to be transmitted to an output terminal 61 for further processing.

Figure 2:
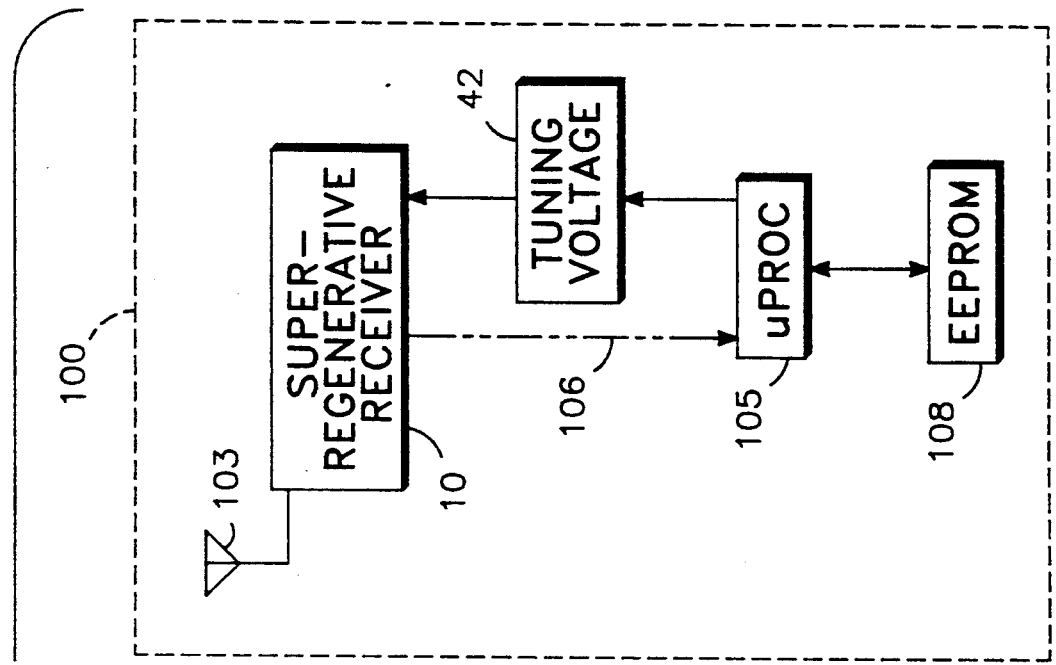
FIG. 2 is a simplified schematic block diagram of the receiver of FIG. 1 in relation to a microprocessor which controls a tuning voltage in response to test module control signals.
Figure 2:
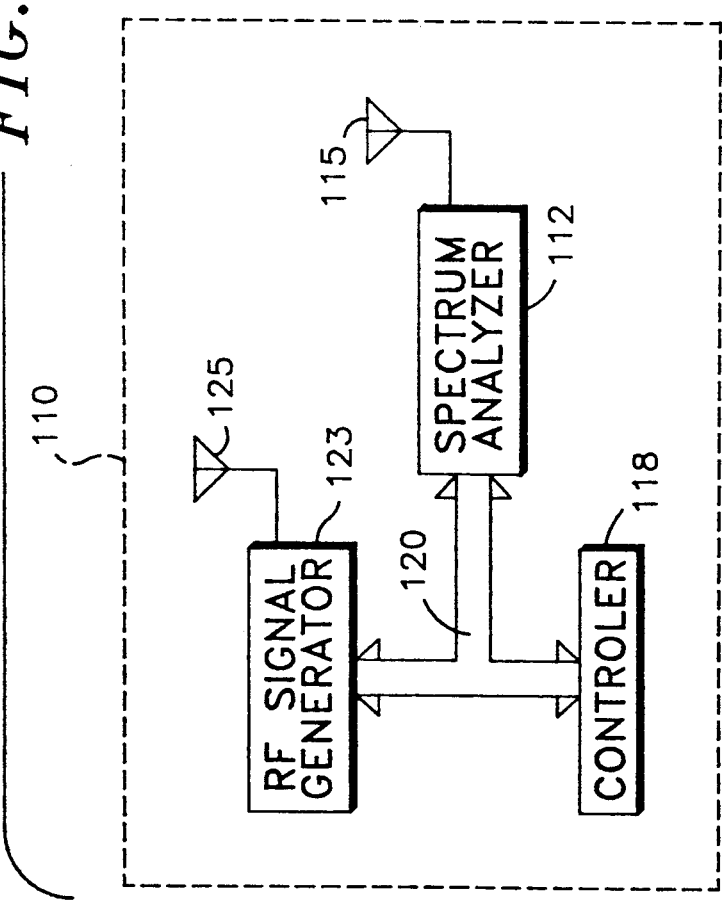

Referring to FIG. 2, the super-regenerative receiver 10 is shown as part of an electronically tuned receiver module 100 having automated tuning of the receiver center operating frequency in accordance with the present invention. The module 100 includes an antenna 103 for receiving rf input signals, and for providing those signals to the receiver 10. The module 100 also includes a microprocessor ($\mu$PROC) 105 for controlling the tuning voltage 42 supplied to the receiver to thereby adjust the receiver center operating frequency. A data storage device 108, e.g., an EEPROM, is provided for permanently storing a reference signal corresponding to the microprocessor signal required to control the tuning voltage to a desired reference value.

The receiver is tuned using a test module 110. The test module 110 includes a spectrum analyzer 112 which receives rf signals via an antenna 115 and provides the signals to a controller 118 on a signal bus 120. A signal generator 123 receives control signals from the controller 118 on the signal bus 120, and in response, transmits rf signals via a transmit antenna 125. The test module 110 is used upon initial power up of the receiver module 100 to set the reference signal stored in the EEPROM 108.

The operation of the receiver module 100 and the test module 110 are best understood by example. Upon initial power up of the receiver 10, it begins to oscillate at a receiver frequency ($F_{SRR}$) approximately equal to the desired receiver center operating frequency ($F_{OP}$). The receiver frequency corresponds to the receiver center frequency of reception. The receiver frequency is provided to the spectrum analyzer 112 via the antenna 115, and the spectrum analyzer provides a frequency signal indicative of the received frequency to the controller 118 on the signal bus 120. Thereafter, the controller 118 provides signals to the signal generator 123 on the signal bus 120 to cause it to oscillate such that the signal generator frequency ($F_{SG}$) is equal to the receiver frequency. The signal generator frequency is initially set equal to the receiver frequency so that control signals transmitted by the signal generator may be received by the receiver, and thereafter provided on the line 106 to the microprocessor for adjusting the tuning voltage.

Figure 3:
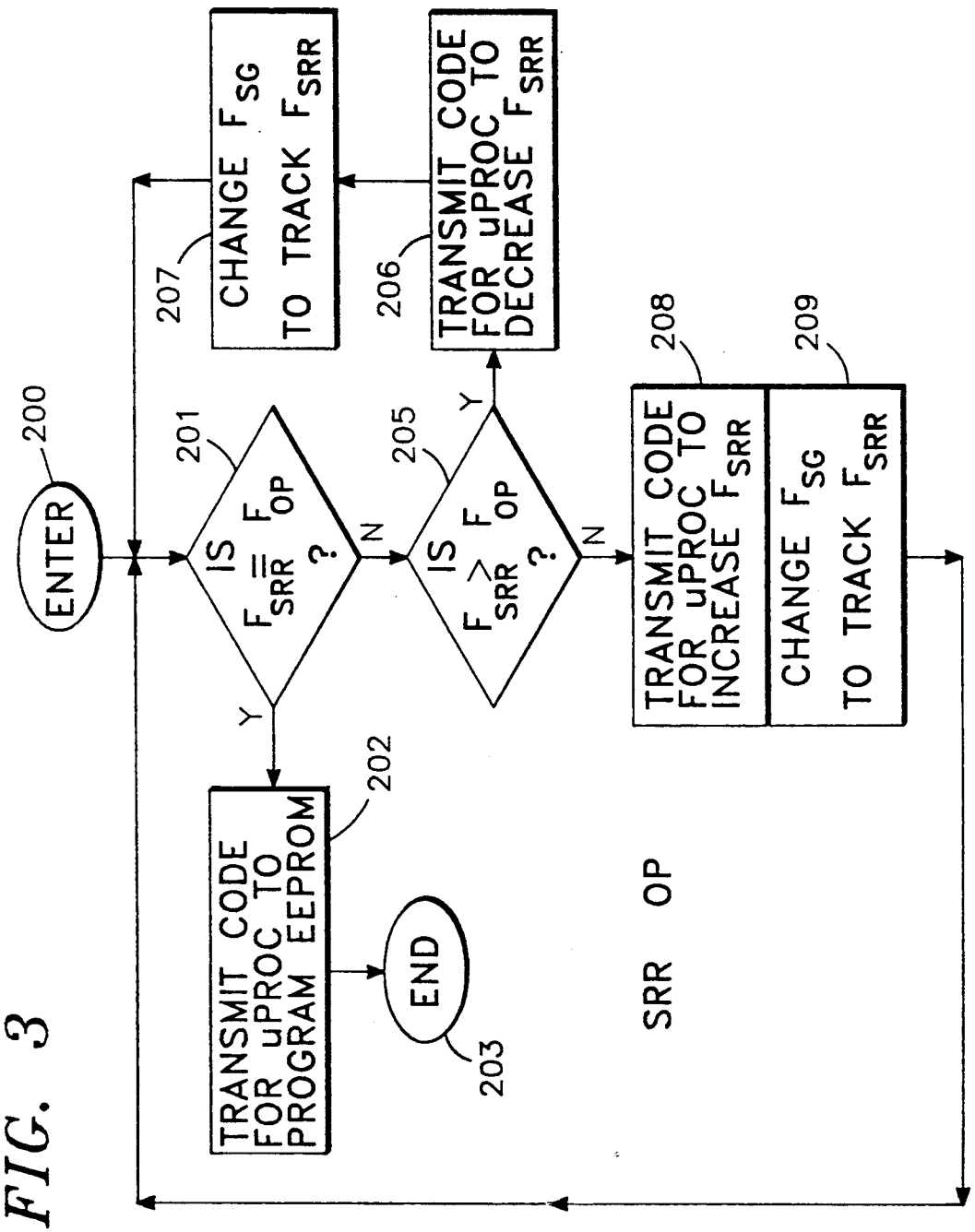
FIG. 3 is a flow routine executed by a test module controller for providing control signals to the microprocessor of FIG. 2.

The controller 118 performs the subroutine of FIG. 3 to set the receiver frequency equal to the desired receiver center operating frequency. The subroutine is entered in a step 200, and then it checks in a test 201 if the receiver frequency is equal to the center operating frequency. If the results of the test are positive, step 202 is performed wherein the controller provides a coded control signal to the signal generator on the signal bus 120. The signal generator transmits the coded control signal via the antenna 125, and the control signal is received by the receiver module via the antenna 103 and provided as an input signal to the receiver 10. The input signal received by the receiver is provided to the microprocessor 105 on the line 106. The microprocessor stores the coded signal corresponding to the center operating frequency in the EEPROM 108 for permanent reference. The subroutine then ends in a step 203. Therefore, if the power is ever removed from the receiver module, the value for the proper tuning voltage can be read out of the EEPROM by the microprocessor.

If the results of the test 201 are negative, the receiver frequency is not equal to the center operating frequency, and the controller checks in a test 205 if the receiver frequency is greater than the center operating frequency. If the results of the test 205 are positive, steps 206 and 207 are consecutively performed wherein the controller transmits a coded signal via the signal generator directing the microprocessor to change the tuning voltage to decrease the receiver frequency, and, after the microprocessor adjusts the tuning voltage, the controller adjusts the signal generator frequency to track the receiver frequency. If the results of the test 205 are negative, steps 208 and 209 are consecutively performed wherein the controller transmits a coded signal via the signal generator directing the microprocessor to change the tuning voltage to increase the receiver frequency, and, after the microprocessor adjusts the tuning voltage, the controller adjusts the signal generator frequency to track the receiver frequency.

After the tuning voltage is adjusted to either increase or decrease the receiver frequency, the test 201 is again performed to determine if the receiver frequency is now equal to the center operating frequency. If the receiver frequency is not yet equal to the center operating frequency, the test 205 and steps 206 and 207 or steps 208 and 209 are again performed to adjust the tuning voltage. Once the receiver frequency is equal to the center operating frequency, the step 202 is performed wherein the EEPROM is programmed to store the coded signal corresponding to the center operating frequency for permanent reference. The subroutine then ends in the step 203. Therefore, the present invention provides automated tuning of a receiver center operating frequency using a tuning voltage to vary the capacitance of a varactor diode, and further provides the permanent storage of the reference tuning voltage level.

Although the invention is illustrated as having a SAW device as the phase shift element in the receiver feedback circuit, the invention will work equally as well with a receiver having an LC circuit as the feedback element. Additionally, the invention is illustrated as using a varactor diode as the variable capacitance device for adjusting the receiver center frequency of operation; however, it is expected that other variable capacitance devices will work equally as well.

Although the invention has been illustrated and described with respect to exemplary embodiments thereof, it should be understood by those skilled in the art that the foregoing and various other changes, omissions and additions may be made therein and thereto, without departing from the spirit and scope of the invention.

We claim:

1. Apparatus for receiving rf signals comprising:
   an oscillator having a signal output and a signal input;
   phase shift means connected in a feedback loop for coupling said signal output to said signal input to cause oscillations of said oscillator at an oscillator center operating frequency;
   quench oscillator means coupled to said signal input for providing a quench voltage at a quench frequency which switches said oscillator between an oscillating and a non-oscillating condition at said quench frequency;
   variable capacitance means connected between said signal output and a reference potential, said oscillator center operating frequency changing in response to changes in the capacitance of said variable capacitance means; and
   tuning means for providing a tuning signal to said variable capacitance means, the capacitance of said variable capacitance means changing in response to changes in said tuning signal.

2. Apparatus according to claim 1 further comprising control means responsive to said oscillator center operating frequency for providing a control signal to said tuning means for varying said tuning signal to adjust said oscillator center operating frequency to be equal to a desired center operating frequency.

3. Apparatus according to claim 2 further comprising signal storage means for storing a tuning signal required to produce oscillations of said oscillator at said desired center operating frequency.

4. Apparatus according to claim 3 wherein said control means comprises:
   detector means for detecting said oscillator center operating frequency and for providing a frequency signal indicative thereof;
   a signal generator for transmitting control signals; and
   a controller responsive to said frequency signal for providing a control signal to said signal generator for transmission at a frequency equal to said oscillator center operating frequency, wherein said oscillator receives said control signal after transmission by said signal generator and provides said control signal to said tuning means for changing said tuning signal.

5. An electrically tuned super-regenerative receiver comprising:
   an oscillator having a signal output and a signal input;
   phase shift means connected in a feedback loop for coupling said signal output to said signal input to cause oscillations of said oscillator at an oscillator center operating frequency;
   quench oscillator means coupled to said signal input for switching said oscillator between an oscillating and a non-oscillating condition;
   variable capacitance means connected between said signal output and a reference potential, said oscillator center operating frequency changing in response to changes in the capacitance of said variable capacitance means; and
   frequency control means responsive to said oscillator center operating frequency for providing a tuning signal to said variable capacitance means, the capacitance of said variable capacitance means changing in response to changes in said tuning signal for changing said oscillator center operating frequency.

6. The electrically tuned super-regenerative receiver according to claim 5 wherein said frequency control means comprises:
  detector means for detecting said oscillator center operating frequency and providing a frequency signal indicative thereof;
  a controller responsive to said frequency signal for providing a control signal indicative of the difference between said oscillator center operating frequency and a reference frequency; and
  microprocessor means responsive to said control signal for providing a tuning signal to said variable capacitance means to change said oscillator center operating frequency to be equal to said reference frequency.

7. The electrically tuned super-regenerative receiver according to claim 6 further comprising signal generator means responsive to said control signal for transmitting said control signal at a frequency equal to said oscillator center operating frequency.

8. The electrically tuned super-regenerative receiver according to claim 6 further comprising signal storage means for storing a tuning signal required to produce oscillations of said oscillator at said reference frequency.

9. The method of electrically tuning a super-regenerative receiver, the receiver having a signal output and a signal input, phase shift means connected in a feedback loop for coupling said signal output to said signal input to cause oscillations of the oscillator at an oscillator center operating frequency, and a quench oscillator coupled to the signal input for switching the oscillator between an oscillating and a non-oscillating condition, the method comprising the steps of:
  connecting variable capacitance means between the signal output and a reference potential, the oscillator center operating frequency changing in response to changes in the capacitance of said variable capacitance means;
  operating the receiver;
  detecting the oscillator center operating frequency;
  comparing the oscillator center operating frequency to a reference frequency;
  providing a control signal indicative of the difference between the oscillator center operating frequency and said reference frequency;
  providing a tuning signal to said variable capacitance means in response to said control signal, the capacitance of said variable capacitance means changing in response to said tuning signal to change the oscillator center operating frequency to be equal to said reference frequency.

10. The method of claim 9 further comprising the step of storing the tuning signal required to produce oscillations of the oscillator at said reference frequency.

11. The method of forming an electrically tunable super-regenerative receiver comprising the steps of:
  providing an oscillator having a signal output and a signal input;
  connecting phase shift means in a feedback loop for coupling said signal output to said signal input to cause oscillations of said oscillator at an oscillator center operating frequency;
  coupling quench oscillator means to said signal input for switching said oscillator between an oscillating and a non-oscillating condition;
  connecting variable capacitance means between said signal output and a reference potential, said oscillator center operating frequency changing in response to changes in the capacitance of said variable capacitance means; and
  providing a tuning signal to said variable capacitance means for changing the capacitance of said variable capacitance means.

12. The method of claim 11 further comprising the step of providing microprocessor means responsive to a control signal for controlling said tuning signal to change said oscillator center operating frequency to be equal to a reference frequency.

13. The method of claim 12 further comprising the step of providing signal storage means for storing the tuning signal required to produce oscillations of said oscillator at said reference frequency.

* * * * *